United States Patent
Lung

(10) Patent No.: US 7,619,237 B2
(45) Date of Patent: Nov. 17, 2009

(54) PROGRAMMABLE RESISTIVE MEMORY CELL WITH SELF-FORMING GAP

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/677,392

(22) Filed: Feb. 21, 2007

(65) Prior Publication Data
US 2008/0197333 A1    Aug. 21, 2008

(51) Int. Cl.
*H01L 29/00* (2006.01)
(52) U.S. Cl. ............ 257/2; 257/3; 257/5; 257/E45.002; 438/103
(58) Field of Classification Search ............... 257/2–5, 257/E45.002; 438/102, 103
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |
| 5,166,096 A | 11/1992 | Cote et al. |
| 5,166,758 A | 11/1992 | Ovshinsky et al. |
| 5,177,567 A | 1/1993 | Klersy et al. |
| 5,534,712 A | 7/1996 | Ovshinsky et al. |
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |

(Continued)

FOREIGN PATENT DOCUMENTS

WO    WO 00/45108 A1    8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Lex Malsawma
*Assistant Examiner*—Robert Huber
(74) *Attorney, Agent, or Firm*—Haynes Beffel & Wolfeld LLP

(57) ABSTRACT

A memory device has a first electrode, a second electrode, and memory material defining an inter-electrode current path between the first electrode and the second electrode. A gap is formed by shrinkage of the shrinkable material between the memory material and a shrinkable material next to the memory material.

21 Claims, 8 Drawing Sheets

U.S. PATENT DOCUMENTS

| | | | |
|---|---|---|---|
| 6,031,287 A | 2/2000 | Harshfield | |
| 6,034,882 A | 3/2000 | Johnson et al. | |
| 6,077,729 A | 6/2000 | Harshfield | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,314,014 B1 | 11/2001 | Lowrey et al. | |
| 6,320,786 B1 | 11/2001 | Chang et al. | |
| 6,339,544 B1 | 1/2002 | Chiang et al. | |
| 6,351,406 B1 | 2/2002 | Johnson et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,534,781 B2 | 3/2003 | Dennison | |
| 6,545,903 B1 | 4/2003 | Wu | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,744,088 B1 | 6/2004 | Dennison | |
| 6,791,102 B2 | 9/2004 | Johnson et al. | |
| 6,797,979 B2 | 9/2004 | Chiang et al. | |
| 6,805,563 B2 | 10/2004 | Ohashi | |
| 6,815,704 B1 | 11/2004 | Chen | |
| 6,859,389 B2 | 2/2005 | Idehara | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,888,750 B2 | 5/2005 | Walker et al. | |
| 6,894,305 B2 | 5/2005 | Yi et al. | |
| 6,909,107 B2 | 6/2005 | Rodgers et al. | |
| 6,927,410 B2 | 8/2005 | Chen | |
| 6,933,516 B2 | 8/2005 | Xu | |
| 6,936,840 B2 | 8/2005 | Sun et al. | |
| 6,937,507 B2 | 8/2005 | Chen | |
| 6,992,932 B2 | 1/2006 | Cohen | |
| 7,042,001 B2 | 5/2006 | Kim et al. | |
| 7,132,675 B2 | 11/2006 | Gilton | |
| 7,449,710 B2* | 11/2008 | Lung | 257/2 |
| 2004/0248339 A1 | 12/2004 | Lung | |
| 2005/0093022 A1 | 5/2005 | Lung | |
| 2005/0215009 A1 | 9/2005 | Cho | |
| 2006/0163554 A1* | 7/2006 | Lankhorst et al. | 257/4 |
| 2007/0126040 A1* | 6/2007 | Lung | 257/295 |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pages.

Blake thesis, "Investigation of GeTeSb5 Chalcogenide Films for Use as an Analog Memory," AFIT/GE/ENG/00M-04, Mar. 2000, 121 pages.

Chen, AN et al., "Non-Volatile Resistive Switching for Advanced Memory Applications," IEEE IEDM, Dec. 5-7, 2005, 4 pages.

Cho, S. L. et al., "Highly Scalable On-axis Confined Cell Structure for High Density PRAM beyond 256Mb" 2005 Symposium on VLSI Technology Digest of Technical Papers, pp. 96-97.

Gibson, G. A. et al, "Phase-change Recording Medium that Enables Ultrahigh- density Electron-beam Data Storage," Applied Physics Letter, 2005, 3 pages., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pages.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pages.

Haring Bolivar, P. et al., "Lateral Design for Phase Change Random Access Memory Cells with Low-Current Consumption," presented at 3rd E*PCOS 04 Symposium in Balzers, Principally of Liechtenstein, Sep. 4-7, 2004, 4 pages.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24μ-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pages.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pages., Nature Materials Advance Online Publication, www.nature.com/naturematerials.

"Magnetic Bit Boost," www.sciencenews.org, Dec. 18-25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1- 80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novelμ Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_ P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yl, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21- 26.

* cited by examiner

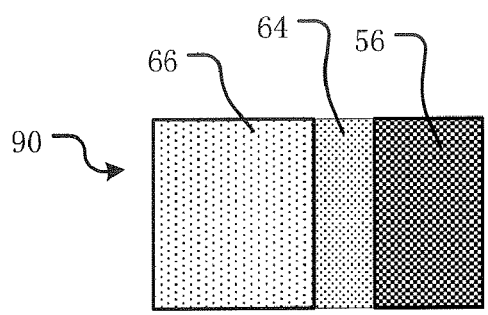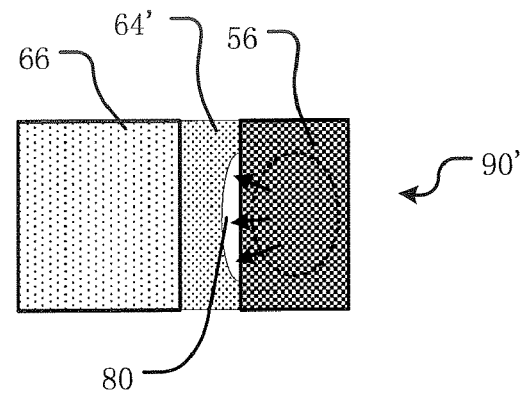
FIG. 11A   FIG. 11B
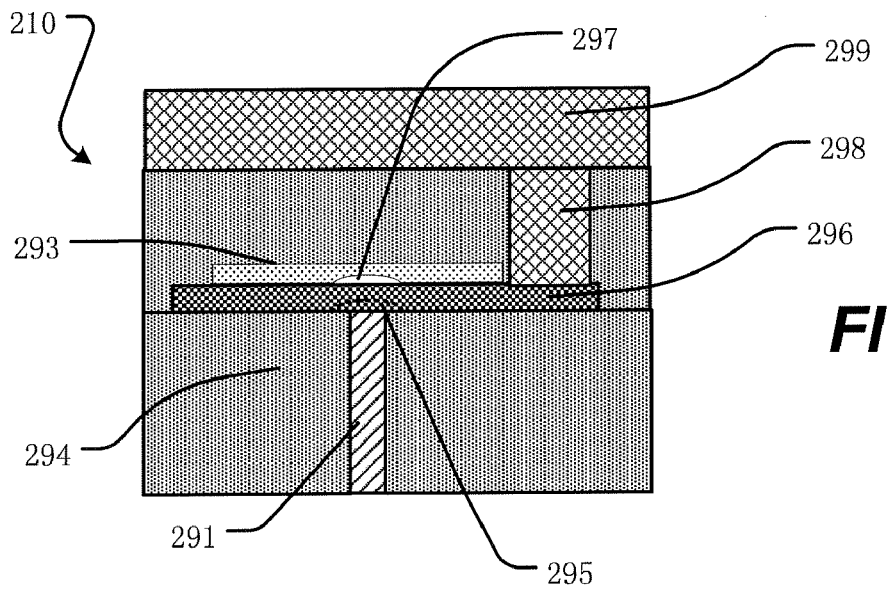
FIG. 12
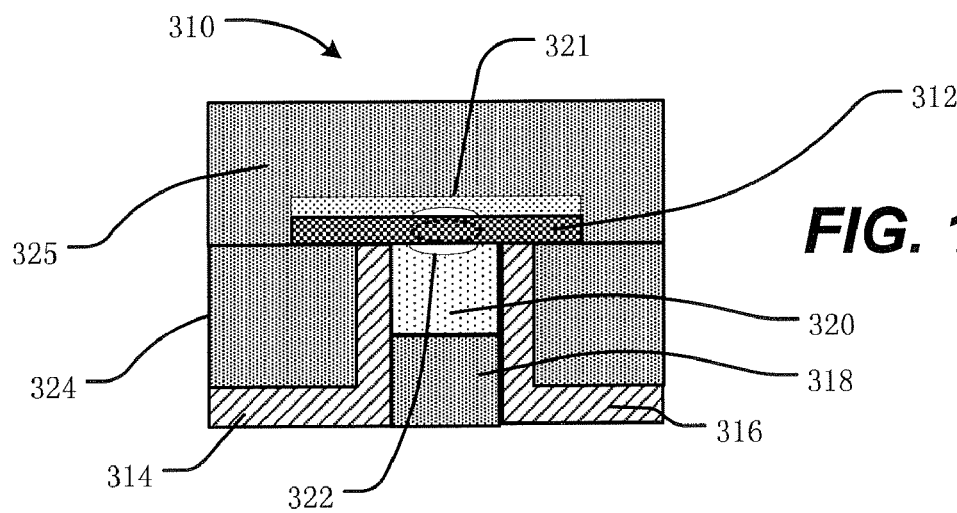
FIG. 13

PROGRAMMABLE RESISTIVE MEMORY CELL WITH SELF-FORMING GAP

International Business Machines Corporation, a New York corporation; Macronix International Corporation, a Taiwan corporation, and Infineon Technologies A.G., a German corporation, are parties to a Joint Research Agreement.

BACKGROUND OF THE INVENTION

1. Field of the Invention

The present invention relates to resistively programmable materials, such as phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element. The terms "set" and "reset" are arbitrarily chosen relative to operation of a memory cell and are used herein only for purposes of convenient discussion.

Problems have arisen in manufacturing such devices with very small dimensions, and with variations in process that meet tight specifications needed for large-scale memory devices. One problem associated with the small dimensions of phase change cells has arisen because of the thermal conductivity of materials surrounding the active region. In order to cause phase transitions, the temperature of the active region in the phase change material must reach phase transition thresholds. However, heat generated by the current through the material is conducted away by surrounding structures. This conduction of heat away from the active region in the phase change material slows down the heating effect of the current and interferes with the operation to change the phase. Prior art technologies address this problem by forming thermally insulating barriers around the phase change material. In one approach, a sealed void is formed surrounding the memory material is described in U.S. Pat. No. 6,815,704 by Chen, entitled PHASE CHANGE MEMORY DEVICE EMPLOYING THERMALLY INSULATING VOIDS.

The formation of thermally insulating voids around the phase change material provides excellent thermal insulation. However, prior art processes for forming such voids are difficult and unreliable, and not very well positioned relative to the active region of the phase change memory elements.

It is desirable therefore to method for manufacturing a phase change memory cell with thermally insulating voids that is practical to implement, and accurately positions the voids adjacent the active regions.

SUMMARY OF THE INVENTION

A phase change random access memory PCRAM device is described suitable for use in large-scale integrated circuits. Technology described herein includes a memory device comprising a first electrode, a second electrode, and memory material defining an inter-electrode current path between the first electrode and the second electrode. The memory material has at least two solid phases that are reversible, such as a chalcogenide-based material or other related material, by applying a current through the material or applying a voltage across the first and second electrodes.

A gap is formed between the active region in the memory material and a shrinkable material next to the active region memory material. The gap thermally isolates the active portion of the memory material from adjacent shrinkable material. In a particular embodiment, the shrinkable material comprises a porous dielectric material, and the gap is formed by heating the memory material so that porous dielectric material shrinks away from the memory material, forming a gap that is self-aligned to the heated, active portion of memory material. Embodiments of memory cells with thermally isolating gaps include "pillar-type," "bridge-type," and "mushroom-type" memory cells.

In embodiments of the technology described herein, an array of memory cells is provided. The array includes a plurality of memory cells, at least some of which include thermally isolating gaps between active regions of memory material and adjacent dielectric material. In a particular embodiment, electronic pulses, such as re-set pulses, used during operation of the array creates sufficient heat in a active region of the memory material to cause the shrinkable dielectric material to shrink away from the memory material.

Memory cells according to embodiments can be implemented using well understood technology for logic circuitry and memory array circuitry, such as CMOS technology.

Also, in one array embodiment described herein, circuitry above the electrode layer and the array of bridges with thermally insulating blankets includes a plurality of bit lines. In an embodiment having bit lines above the electrode layer that is described herein, electrode members in the electrode layer which act as a first electrode for a memory cell are shared so that a single electrode member provides a first electrode for two memory cells in a column of the array. Also, in an embodiment that is described herein, bit lines in the plurality of bit lines are arranged along corresponding columns in the array, and two adjacent memory cells in the corresponding columns share a contact structure for contacting said first electrodes.

A method for manufacturing a memory device is also described. The method comprises forming a first electrode; forming memory material electrically coupled to the first electrode; forming shrinkable dielectric material contacting the memory material; forming a second electrode; and then forming a gap between a portion of the memory material and a portion of the shrinkable dielectric material.

Other aspects and advantages of the present invention can be seen from review of the figures, the detailed description and the claims which follow.

BRIEF DESCRIPTION OF THE DRAWINGS

FIG. 11A and FIG. 11B are cross sections of a portion of a memory cell illustrating shrinkage of a porous dielectric material so as to form a thermally isolating gap according to an embodiment of the invention.

FIG. 12 is a cross section of a "mushroom" type memory cell with a thermally isolating gap according to an embodiment of the invention.

FIG. 13 is a cross section of a "bridge" type memory cell with a thermally isolating gap according to an embodiment of the invention.

DETAILED DESCRIPTION

A detailed description of thin film fuse phase change memory cells, arrays of such memory cells, and methods for manufacturing such memory cells, is provided with reference to FIGS. 1-15.

Figure 1:
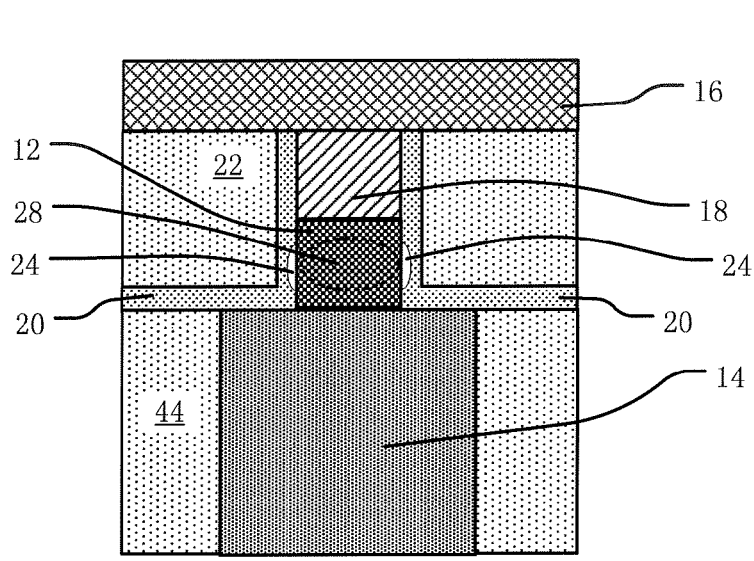
FIG. 1 illustrates an embodiment of a memory cell with a thermally isolating gap according to an embodiment of the invention.

FIG. 1 illustrates a basic structure of a memory cell 10 including a pillar of memory material 12 on a first electrode 14, a second electrode 16 including a conductive pillar 18, a shrinkable layer 20 surrounding the memory material 12 which is preferably a dielectric material or other material more resistive than that of the programmable resistive material in its high resistance state, dielectric material 22 (also called "dielectric fill-in material"), and a circumferential gap 24 formed in the shrinkable layer next to the pillar of memory material 12. The gap is a void in the shrinkable layer 20 that is self-forming, and thereby self-aligned.

In a particular embodiment, the memory material is a programmable resistive material that forms an inter-electrode current path and changes from a first resistance to a second resistance in response to a programming signal or a resetting signal, such as a chalcogenide-based phase change memory material, applied between the first and second electrodes and that can typically be programmed and reset many thousands of times. The conductive pillar 18 is titanium nitride, or other suitable material chosen for compatibility with the programmable resistive material and the underlying contact, such as TaN, TiAlN, TaAlN, or one or more elements selected from the group consisting of Ti, W, Mo, Al, Ta, Cu, Pt, Ir, La, Ni, and Ru and alloys thereof, that conducts electricity between the second electrode 16, which is typically a patterned metal layer, and the pillar of memory material 12, and provides a diffusion barrier between the memory material and the second electrode, which often includes a metal layer, such as a copper layer or an aluminum layer.

The pillar of memory material 12 includes an active region 28, in which the changes in resistivity occur in response to heat generated during programming and reseting processes. For example, using a chalcogenide-based phase change memory material, the active region 28 may be set (programmed) to a relatively low resistivity crystalline state, and can be reset to relatively high resistivity amorphous state. The programmable resistive memory material maintains its resistivity state between programming and reset signals (i.e. is non-volatile), and the state of the memory cell 10 is determined by reading the resistivity between the first electrode 14 and the second electrode 16, as is well-understood in the art of electronic memories.

During programming and resetting heat generation is focused in the active region 28. The shrinkable layer 20 shrinks in the region next to the active region 28 in response to heat generated in the active region 28 to form a self-aligned circumferential gap 24, surrounding the active region 28. Electric current is passed through the memory cell so as to heat the active region sufficiently to induce shrinkage of the shrinkable material away from the memory cell to form the gap 24. The electrical signal used to heat the shrinkable layer may be applied during manufacturing, and contain for example the same amount as, or more, power than a resetting signal. For example, the electrical signal used to create the circumferential gap 24 in the shrinkable layer 20 may be of longer duration or higher current than the resetting signal, but subsequent resetting signals require less energy because of the thermal isolation provided from the gap.

The gap 24 forms in a self-aligned manner next to the active region, providing thermal isolation between the active region and the shrinkable layer (i.e. the adjacent dielectric material). In other words, the gap 24 impedes heat flow out of the active region 28 during a programming or resetting operation of the memory cell 10. This reduces the energy required to change the resistive state (i.e. program or reset) of the memory cell 10.

In a particular embodiment, the shrinkable layer 20 is a layer of porous dielectric material. Passing electrical current through the memory cell heats the pillar of memory material 12, particularly the active region 28, heating the porous dielectric material and causing it to shrink. When the porous dielectric material next to the active region 28 shrinks, it pulls away from the pillar of memory material 12, forming the gap 24 that confines heat generated during programming or resetting to the active region 28.

In some embodiments, the porous dielectric material has lower thermal conductivity than the dielectric material 22. This further reduces the conduction of heat from the active region 28 during programming or resetting operations (i.e. further confines heat in the active region 28), and thus is particularly desirable. Various porous dielectric materials, including deposited materials as well as spin-on materials, are known in the art of semiconductor device fabrication, and are often used because of their relatively low dielectric constant. Porous dielectric materials include primarily inorganic materials, as well as inorganic materials in an organic carrier that are processed to leave a porous inorganic matrix. Porous dielectric materials can include silicon, oxygen, nitrogen, carbon, fluorine, or hydrogen, for example. Many low-K materials, where low-K materials have permittivity less that that of $SiO_2$, are suitable for use as the shrinkable dielectric material 20, and include fluorinated $SiO_2$, silsesquioxane, polyarylene ethers, parylene, fluoro-polymers, fluorinated amorphous carbon, diamond-like carbon, porous silica, mesoporous silica, porous silsesquioxane, porous polyimide, and porous polyarylene ethers. A single layer or combination of layers can be implemented.

Porous dielectric materials are often limited in their application in semiconductor devices because of their propensity to shrink at elevated temperatures. Many porous dielectric materials are limited to applications (layers) that are not exposed to elevated processing temperatures. However, in the memory cell 10, shrinkage of the porous dielectric layer is a desirable feature.

Access circuitry can be implemented to contact the first electrode 14 and the second electrode 16 in a variety of configurations for controlling the operation of the memory cell 10, so that it can be programmed to set the active region 28 in one of the two solid phases that can be reversibly implemented using the memory material. For example, using a chalcogenide-based phase change memory material, the memory cell may be set to a relatively high resistivity state in which at least a portion of the pillar in the current path is in an amorphous state, and a relatively low resistivity state in which most of the pillar in the current path is in a crystalline state.

The active region 28 in the pillar of memory material 12 is the region in which the memory material is induced to change between the at least two solid phases. In the embodiment shown, the active region 28 lies next to the gap 24 that forms in a self-aligned fashion in the shrinkable layer 20. As can be appreciated, the active region can be made extremely small in the illustrated structure, reducing the magnitude of current needed to induce the phase changes. The self-forming gap automatically aligns itself with the active region.

Embodiments of the memory cell include phase change based memory materials, including chalcogenide based materials and other materials, for the bridge 11. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, ZrOx, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse.

Figure 2:
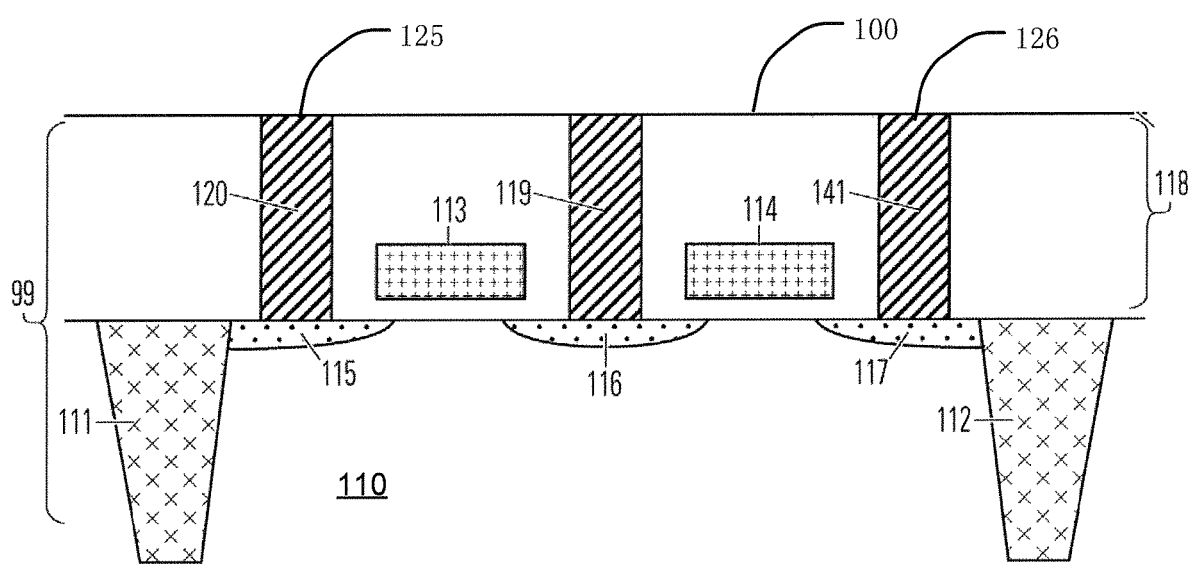
FIG. 2 through FIG. 10 are cross sections illustrating a fabrication sequence of a memory array including memory cells having thermally isolating gaps according to an embodiment of the invention.

FIGS. 2-10 are cross sections illustrating an exemplary manufacturing process for fabricating memory cells according to an embodiment. FIG. 2 illustrates a first stage in the manufacturing process, after typical CMOS processing techniques have been applied, in which a substrate 99 that includes access circuitry has been made. Access circuitry is formed on a semiconductor substrate 110. Isolation structures such as shallow trench isolation STI dielectric trenches 111 and 112 isolate pairs of rows of memory cell access transistors in this example. The access transistors are formed by common source region 116 in the substrate 110, and drain regions 115 and 117 in the substrate 110. Polysilicon word lines 113 and 114 form the gates of the access transistors. The dielectric fill layer 118 is formed over the polysilicon word lines 113, 114. Contact plug structures 141 and 120 contact individual access transistor drains 115 and 117. Common source line 119 contacts source regions along a row in the array. The common source line 119 contacts the common source region 116. The substrate 99 including access circuitry for a plurality of memory cells, has a contact surface 100 with an array of conductive contacts 125, 126 on the top contact surfaces of the contact plugs 121, 141 which are in turn connected to the access circuitry. Other configurations of access circuitry can be used as well, including configurations using diodes rather than transistors.

Figure 3:
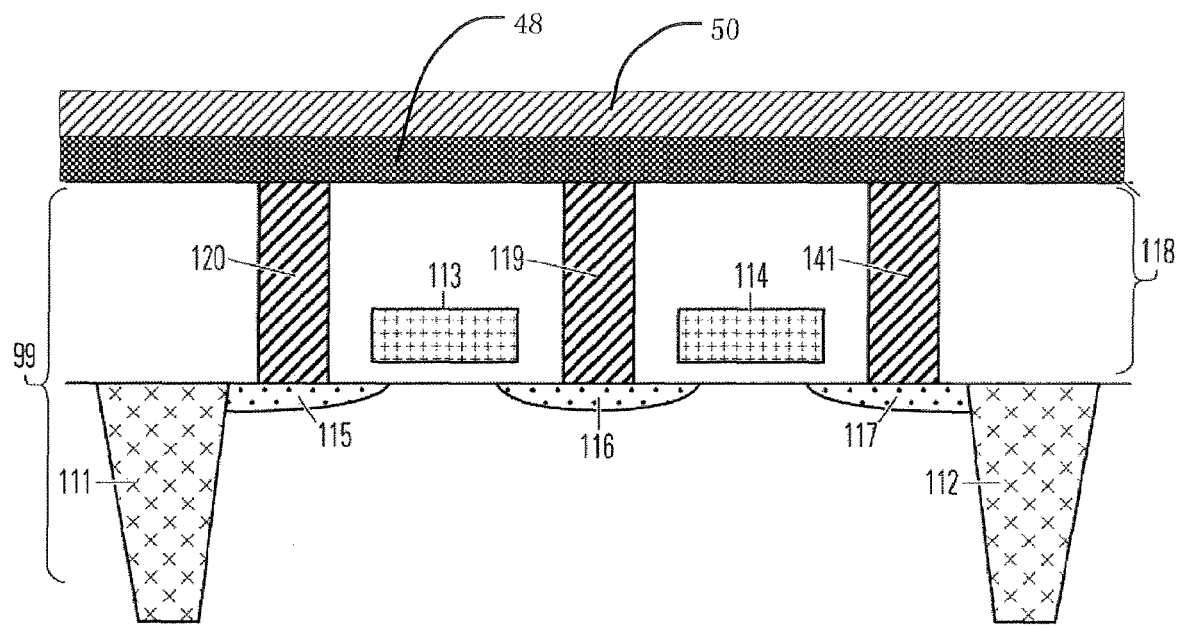

FIG. 3 is a cross section of the wafer shown in FIG. 2 with a layer of memory material 48, such as a layer of GST, and a layer of conductive material 50, such as a layer of TiN. Other memory materials or conductive materials are alternatively used. An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. Also, the combination of DC bias and the collimator can be used simultaneously.

A post-deposition annealing treatment in vacuum or in an $N_2$ ambient is optionally performed to improve the crystallization state of chalcogenide material. The annealing temperature typically ranges from 100° C. to 400° C. with an anneal time of less than 30 minutes.

The conductive material acts as a diffusion barrier between the memory material and a subsequent electrode layer (see FIG. 11, ref. num. 72) while electrically coupling the memory material to the electrode layer.

Figure 4:
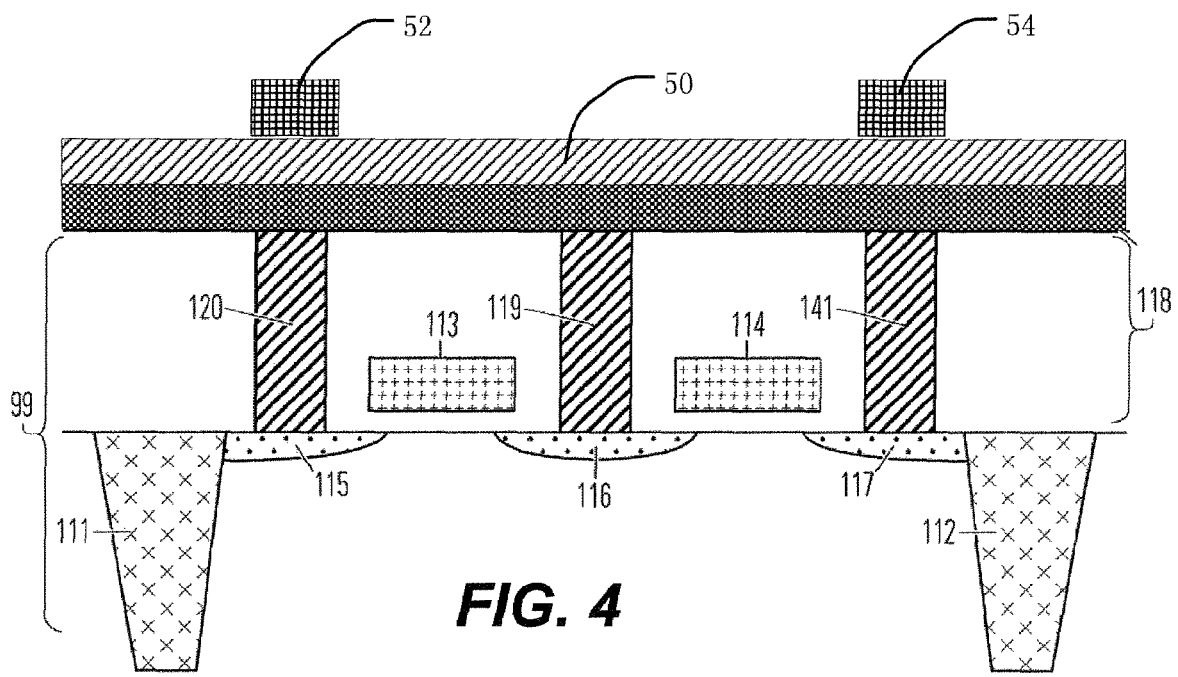

FIG. 4 is a cross section of the wafer shown in FIG. 3 with patterned photoresist 52, 54 on the conductive material layer 50. The patterned photoresist 52, 54 is patterned according to any of several known techniques to provide a mask in a subsequent etch process. The patterned photoresist 52, 54 is positioned generally over the conductive plugs 120, 141 and will be used to form the memory cells. It is generally desirable to make the memory cells as small as practical to provide high packing density and also to minimize the volume of programmable memory material in the cell, and hence reduce the energy required to change resistive states in the active region.

Figure 5:
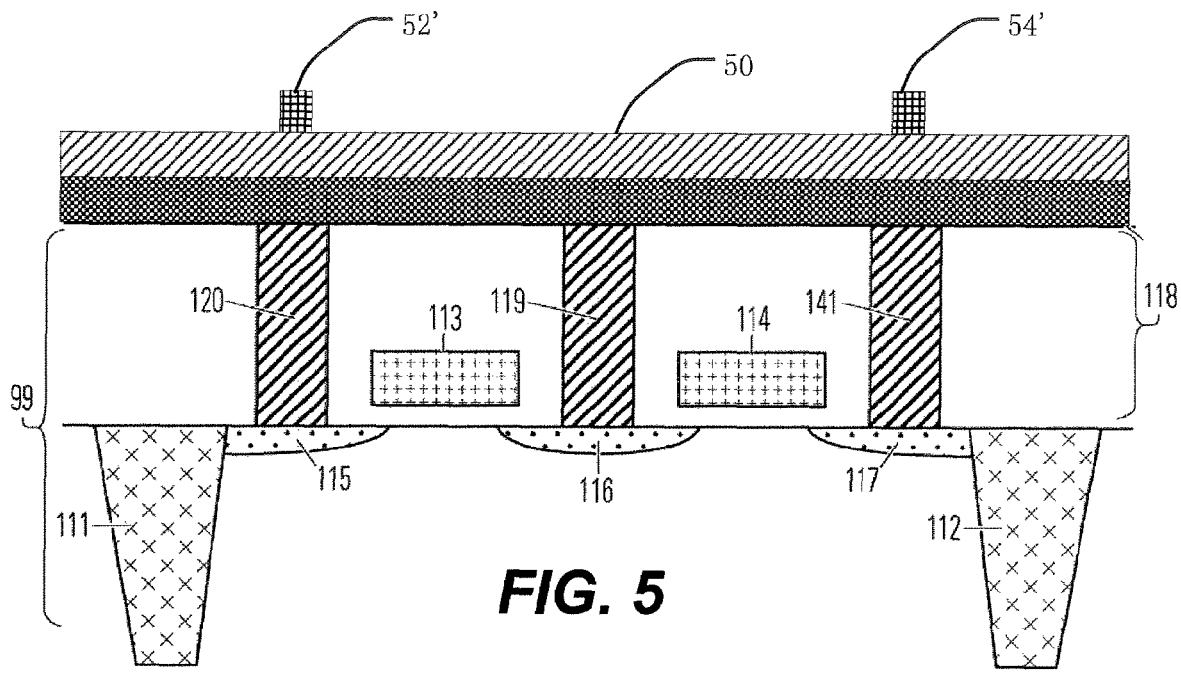

FIG. 5 is a cross section of the wafer shown in FIG. 4 after optionally trimming the photoresist. Trimming reduces the size of the patterned photoresist to less than the minimum photolithographic dimension. For example, if the patterned photoresist 52, 54 shown in FIG. 4 are the smallest that can be made using a particular photolithographic technique, the trimmed patterned photoresist 52', 54' in FIG. 5 is smaller (i.e. "sublithographic"). Trimming allows defining features that are smaller than would be obtained from a purely lithographic process. Photoresist trimming is applied for example using an oxygen plasma to isotropically etch the photoresist, which trims its width and thickness. In an alternative, a hard mask layer, such as a low temperature deposited layer of $SiN_x$ or $SiO_2$ can be defined using photolithography to define a pattern, followed by trimming using an isotropic wet etch, such as dilute HF for silicon dioxide or hot phosphoric acid for silicon nitride, or isotropic fluorine or HBr based reactive ion etching REI etching.

Figure 6:
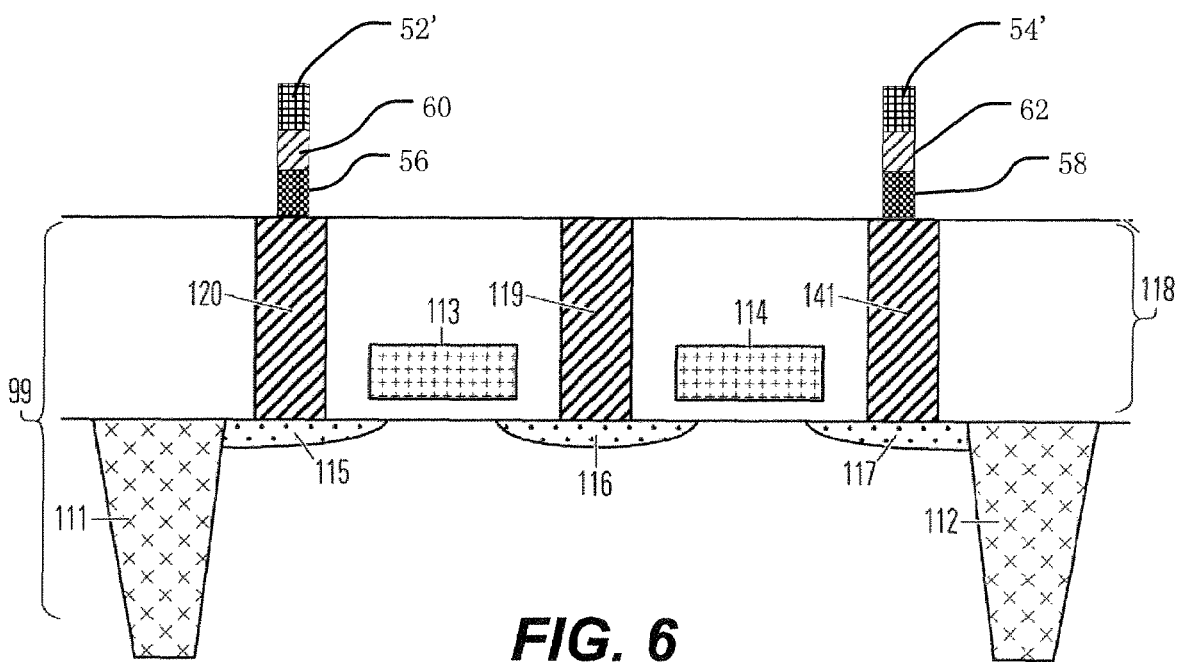

FIG. 6 is a cross section of the wafer shown in FIG. 5 after removing the field portions of the conductive barrier layer and of the memory material layer to form pillars of conductive material 60, 62 and pillars of memory material 56, 58 on the conductive plugs 120, 141. The trimmed patterned photoresist 52', 54', allows forming pillars that are smaller than the minimum photolithographic dimension.

Figure 7:
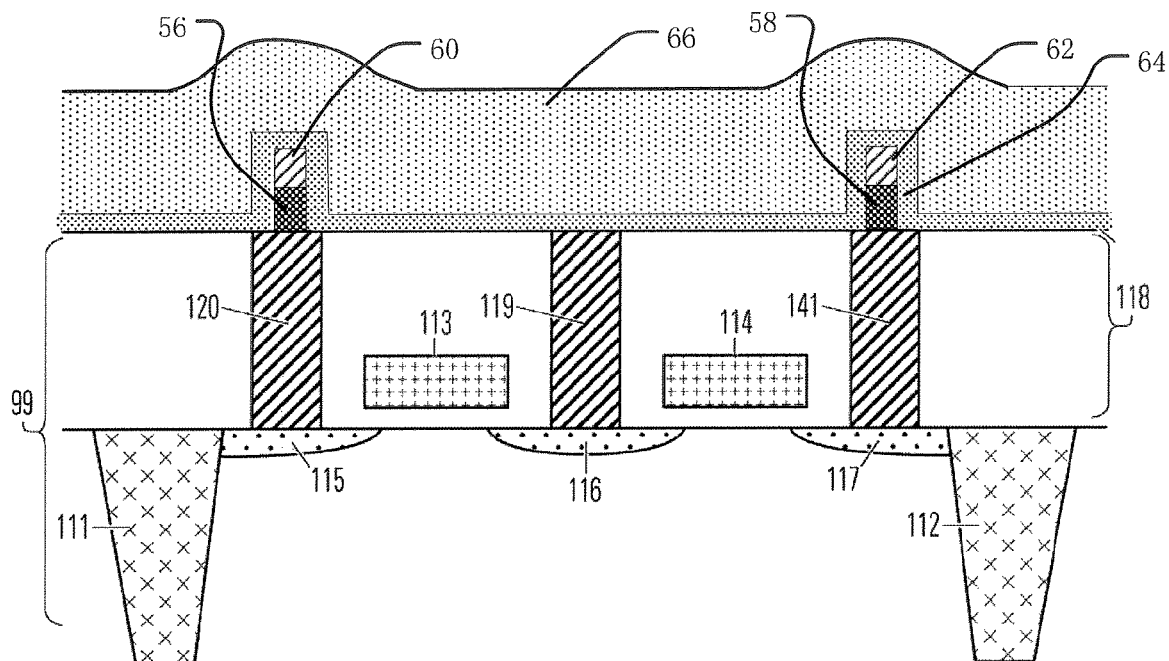

FIG. 7 is a cross section of the wafer shown in FIG. 6, after removal of the photoresist 52', 54' and deposition of a layer of shrinkable material 64 formed over the pillars of conductive material 60, 62 and the pillars of memory material 56, 58, and a layer of dielectric material 66 ("dielectric fill-in layer") formed over the layer of shrinkable material 64. In one embodiment, the shrinkable material is a porous dielectric material that shrinks upon heating. Localized heating in the pillars of memory material 56, 58 cause the shrinkable material to densify and shrink away from the pillars of memory material, forming a gap as described above. The dielectric fill-in layer comprises silicon dioxide, a polyimide, silicon nitride or other dielectric fill materials. In a particular embodiment, the layer of dielectric fill-in material is $SiO_2$ or SiN that is denser than the porous dielectric material layer 64.

Figure 8:
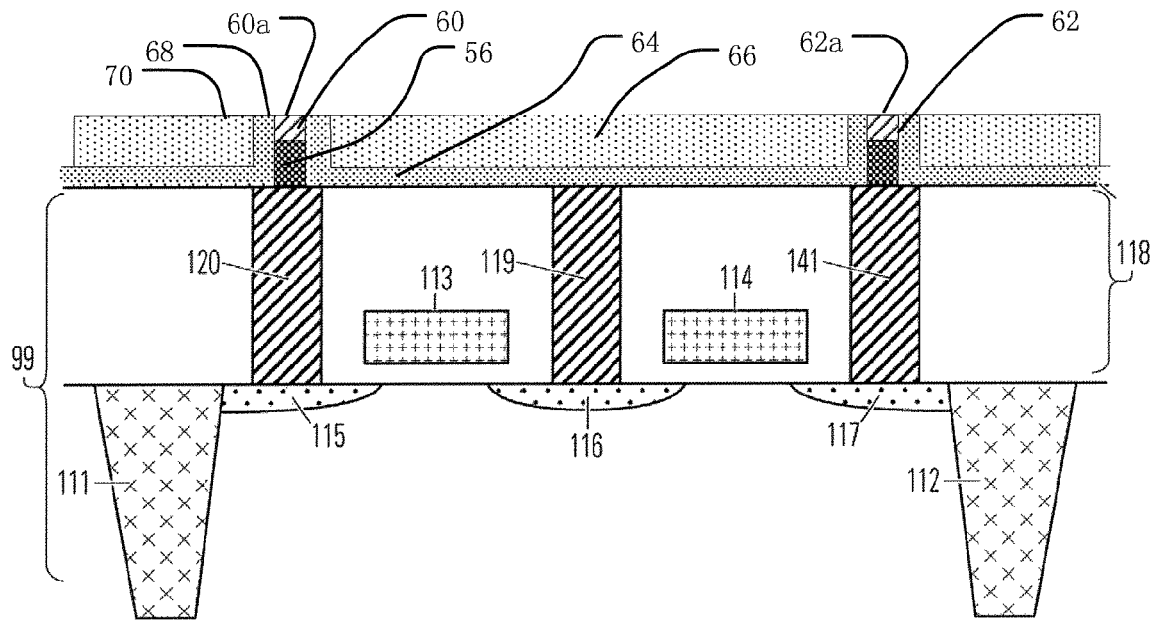

FIG. 8 is a cross section of the wafer shown in FIG. 7 after planarizing the dielectric layer 66 so as to expose top surfaces 60a, 62a of the pillars of conductive material 60, 62 and top surfaces 68 of the shrinkable material layer 64. A chemical-mechanical polishing ("CMP") technique is used in a particular embodiment. The dielectric layer 66 provides mechanical support for the structure of the memory cell and provides a flat surface for further processing. The exposed surface 68 of the shrinkable material layer is relatively narrow and essentially even with the surface 70 of the dielectric layer 66 and surface 60a, 62a of the conductive material.

Figure 9:
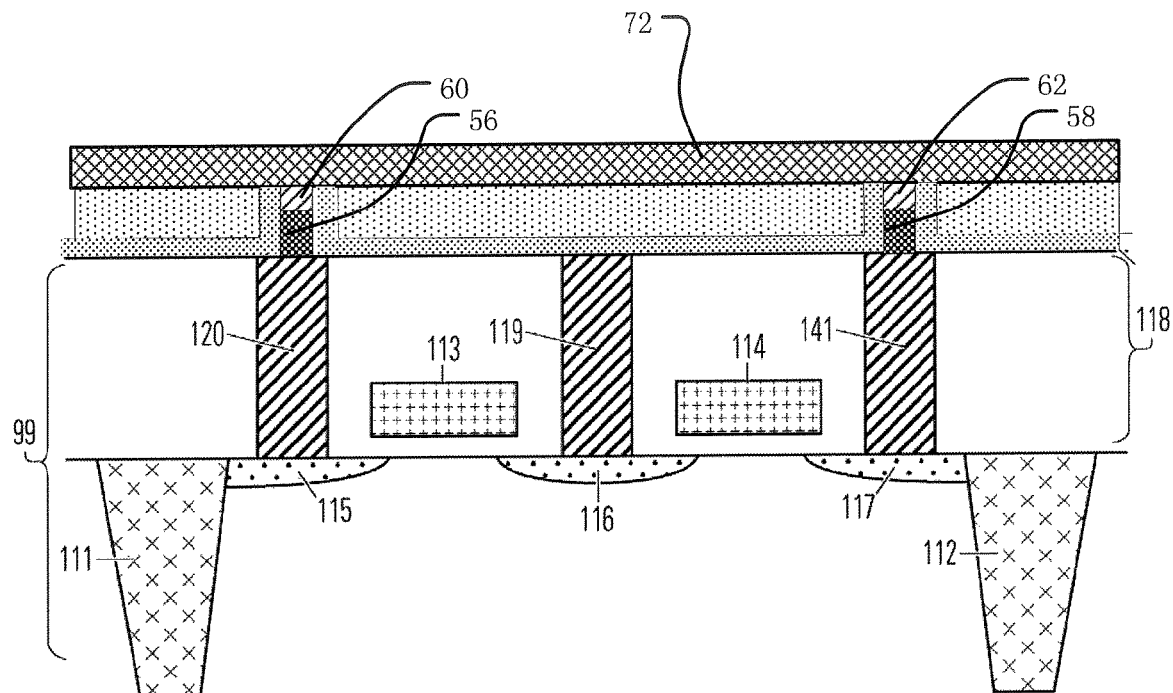
Figure 10:
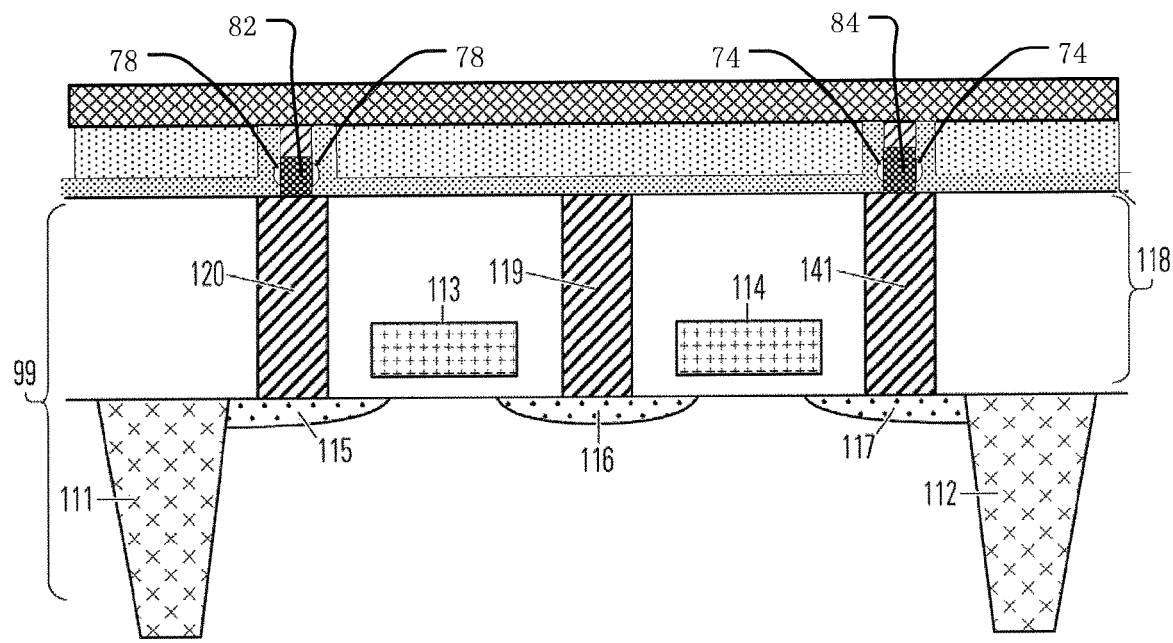

FIG. 9 is a cross section of the wafer shown in FIG. 10 with a conductive layer 72 formed over the dielectric fill-in layer. In a particular embodiment, the conductive layer 72 is a "metal 1" bit line layer. The conductive layer 72 is coupled to the conductive plugs 120, 141 through the conductive pillars 60, 62 and the pillars of memory material 56, 58. The conductive plug 120 forms a first electrode (compare, FIG. 1, ref. num. 14) and the conductive layer forms a second electrode (compare, FIG. 1, ref. num. 16) of a memory cell. Other conductive plug materials are alternatively used, including materials that are used with a diffusion barrier (not shown) between the conductive plug and the memory material.

The memory cell is programmed by passing current through the pillar of memory material 56, which heats an active region (see FIG. 1, ref. num. 28) to change the resistivity state of at least a portion of the memory material from a relatively low resistivity state to a relatively high resistivity state and vice versa.

FIG. 10 is a cross section of the wafer shown in FIG. 11 after gaps 74, 78 have been formed in the layer of shrinkable material 64 (see also, FIG. 1, ref. nums. 24, 26). The gaps form as a result of the shrinkable material shrinking, and pulling away from, the pillars of memory material 56, 58 as electrical current is passed between the conductive plugs 120, 141 and the conductive layer 72, which heats the memory material. The gaps are formed in a representative process during testing of the chip, by applying gap-forming current to memory cells, such as in a one or more set-reset cycles or in a higher current heating pulse sufficient to cause gap formation, on the device. Following the gap forming current is applied, typical device testing is applied.

Only two memory cells are shown in the portion of wafer illustrated in FIGS. 2-10. Typically, an integrated circuit having a memory array according to an embodiment of the invention will have many more, typically thousands or millions, of memory cells.

FIG. 11A is a cross section of a portion of a memory cell 90 showing shrinkable material 64 between memory material 56 and relatively dense dielectric fill material 66 prior to forming a gap. The shrinkable material in this example is a porous dielectric material, such as described above. FIG. 11B is a cross section of the memory cell 90' after selectively forming a gap 80. The shrinkable material 64' has been densified from heat generated in the active region of the memory material 56, shrinking away from the active region of the memory material, which is hotter than the dielectric fill material 66, to form the gap 80. Porous dielectric material is particularly desirable next to the memory material because, even after densification, it has lower heat conductivity and lower heat capacity than similar non-porous dielectric material. The densified porous insulating material further contains heat generated in the memory material 56 during setting and resetting operations. The gap 80 breaks the thermal path between the memory material 56 and the dielectric fill material, confining heat generated during memory cell set and reset operations in the desired region of the memory material.

FIG. 12 is a cross-section of a representative "mushroom" type memory cell 110 including a self-aligned gap according to the technology described herein. The memory cell 110 of FIG. 12 includes a bottom electrode 291 in the form of a pillar through a layer 294 of dielectric material. A layer 296 of memory material is deposited in contact with the top surface of the electrode 291. The small area of the top surface of the electric 291 creates an active region 295 in the layer 296 a memory material. A layer 293 of shrinkable dielectric material is deposited over the layer 296 of memory material in a region covering the active region 295. A dielectric fill layer 300 covers the layer 293 of shrinkable dielectric material and layer 296 of memory material. The layer 296 of memory material is coupled through a conductive plug 298 through the dielectric fill layer 302 a patterned conductive layer 299 that includes bit lines. A gap 297 is created in the tradable dielectric material 293 by application of a gap forming current through the bottom electrode 291 in the manner described above.

FIG. 13 is a cross section of a memory cell 310 according to another embodiment of the invention. This type of memory cell is commonly called a "bridge" type programmable resistive memory cell. Techniques for implementing a narrow bridge of memory material are shown in commonly owned U.S. patent application Ser. No. 11/155,067, entitled THIN FILM FUSE PHASE CHANGE RAM AND MANUFACTURING METHOD, filed 17 Jun. 2005, which is incorporated by reference as if fully set forth herein, and such techniques are readily extended to the composite bridge structure described herein to form very narrow layers of active material in the bridges.

A bridge 312 of memory material, such as GST, is electrically coupled to a first electrode 314 and a second electrode 316 separated by a dielectric fence, which includes a first layer 318 of dielectric and a shrinkable dielectric layer 320. The bridge 312 of memory material is formed on a planarized dielectric layer 324, in which the first electrode 314, dielectric fence, and second electrode 316 have been formed. A second shank will dielectric layer 321 is formed on top of the bridge 312. The dielectric fill during the 25 is formed over the bridge 312. A gap 322 is formed in the shrinkable portion 320 of the fence, and in the shrinkable dielectric layer 321 to form a gap surrounding the active region of the memory material. In embodiments in which the bridge 312 is narrow relative to the size of the active region, and the layer 321 of trickle material surrounds the sides of the bridge, the gap which is formed extends on all four sides of the bridge 312.

In some embodiments (e.g. the memory cell of FIG. 1), the shrinkable dielectric material is formed on the substrate after the memory material is formed on the substrate. In other embodiments (e.g. the memory cell 91 of FIG. 14), the shrinkable dielectric material is formed on the substrate before the memory material is formed on the substrate. However, in each sequence, a portion of the memory material (e.g. the active region) is next to a portion of the shrinkable dielectric material, and one or more gaps are formed between the memory material and the shrinkable dielectric material by shrinking the shrinkable dielectric material. In a particular embodiment, the gaps are formed when the memory material is heated and the heat shrinks the shrinkable memory material next to the memory material. In a more particular embodiment, the active region is heated with a re-set pulse and the heat generated during the re-set process causes the shrinkable dielectric material to shrink. In a further embodiment, successive re-set pulses increases the gap formed between the memory material and the shrinkable dielectric material.

Figure 14:
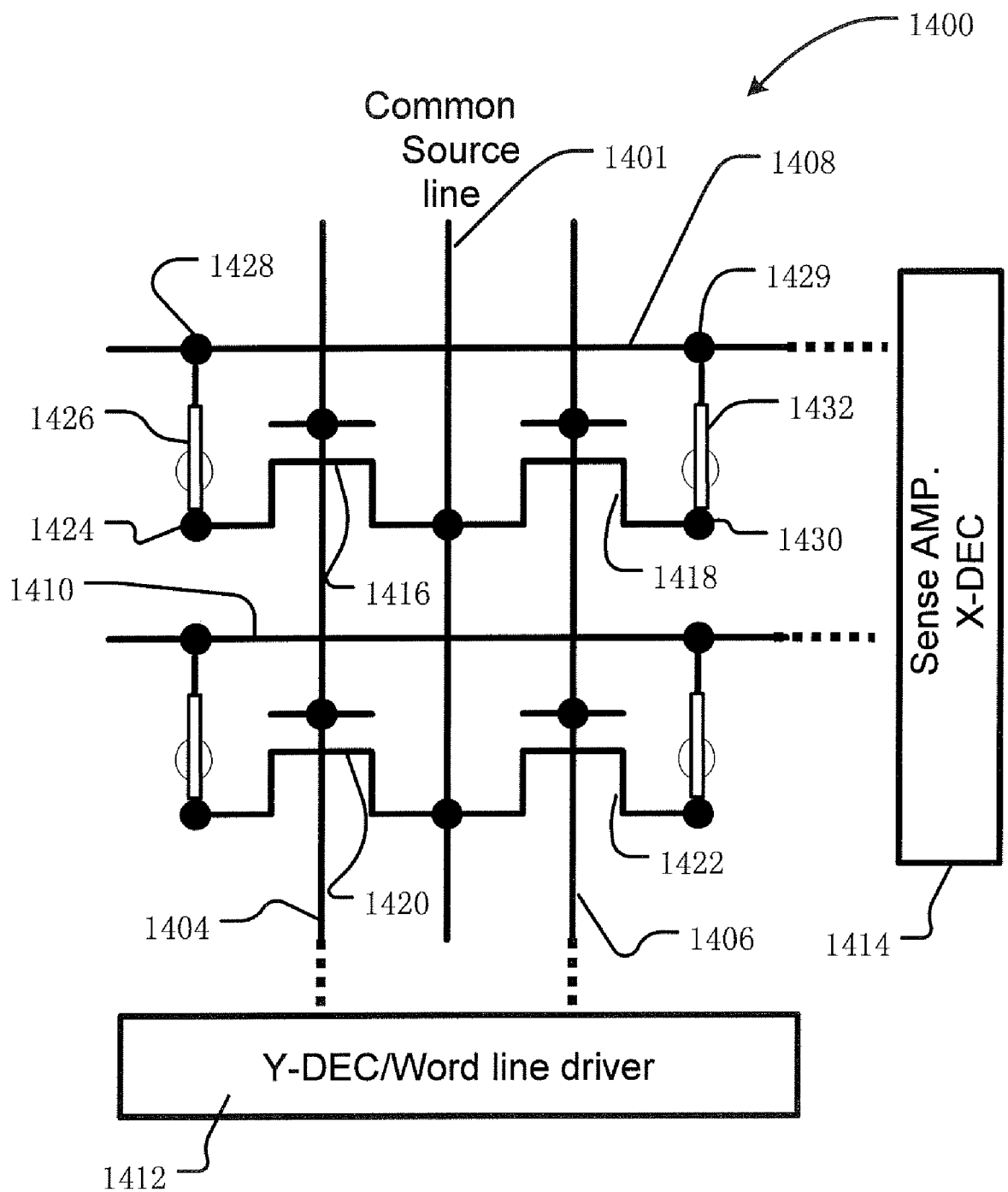
FIG. 14 is a schematic diagram for a memory array comprising phase change memory elements according to an embodiment.

FIG. 14 is a schematic illustration of a memory array 1400, which can be implemented using memory cells as described with reference to FIGS. 1, 12, and 13, or with other memory cells according to embodiments. In a schematic illustration of FIG. 14, the common source line 1401, the word line 1404 and the word line 1406 are arranged generally parallel in the Y-direction. Bit lines 1408, 1410 are arranged generally parallel in the X-direction. Thus, a Y-decoder and a word line driver in block 1412 are coupled to the word lines 1404, 1406. An X-decoder and set of sense amplifiers in block 1414 are coupled to the bit lines 1408, 1410. The common source line 1401 is coupled to the source terminals of access transistors 1416, 1418, 1420, 1422. The gate of access transistor 1416 is coupled to the word line 1404. The gate of access transistor 1418 is coupled to the word line 1406. The gate of access transistor 1420 is coupled to the word line 1404. The gate of access transistor 1422 is coupled to the word line 1406. The drain of access transistor 1416 is coupled to the electrode member 1424 for memory cell 1426, which is in turn coupled to electrode member 1428. Likewise, the drain of access transistor 1418 is coupled to the electrode member 1430 for memory cell 1432, which is in turn coupled to the electrode member 1428. Memory cells 1426, 1432 have gaps selectively formed proximate to memory material in the memory cell so as to thermally isolate a active region of the memory material from adjacent dielectric material.

The electrode member 1428 is coupled memory cell 1426 and to the bit line 1408. The electrode member 1429 is coupled memory cell 1432 and to the bit line 1408. Access transistors 1420, 1422 are coupled to corresponding memory cells as well on line 1410. It can be seen that the common source line 1401 is shared by two rows of memory cells, where a row is arranged in the Y-direction in the illustrated schematic. Likewise, the bit line 1408 is coupled to memory cells in a column in the array, where a column is arranged in the X-direction in the illustrated schematic.

Figure 15:
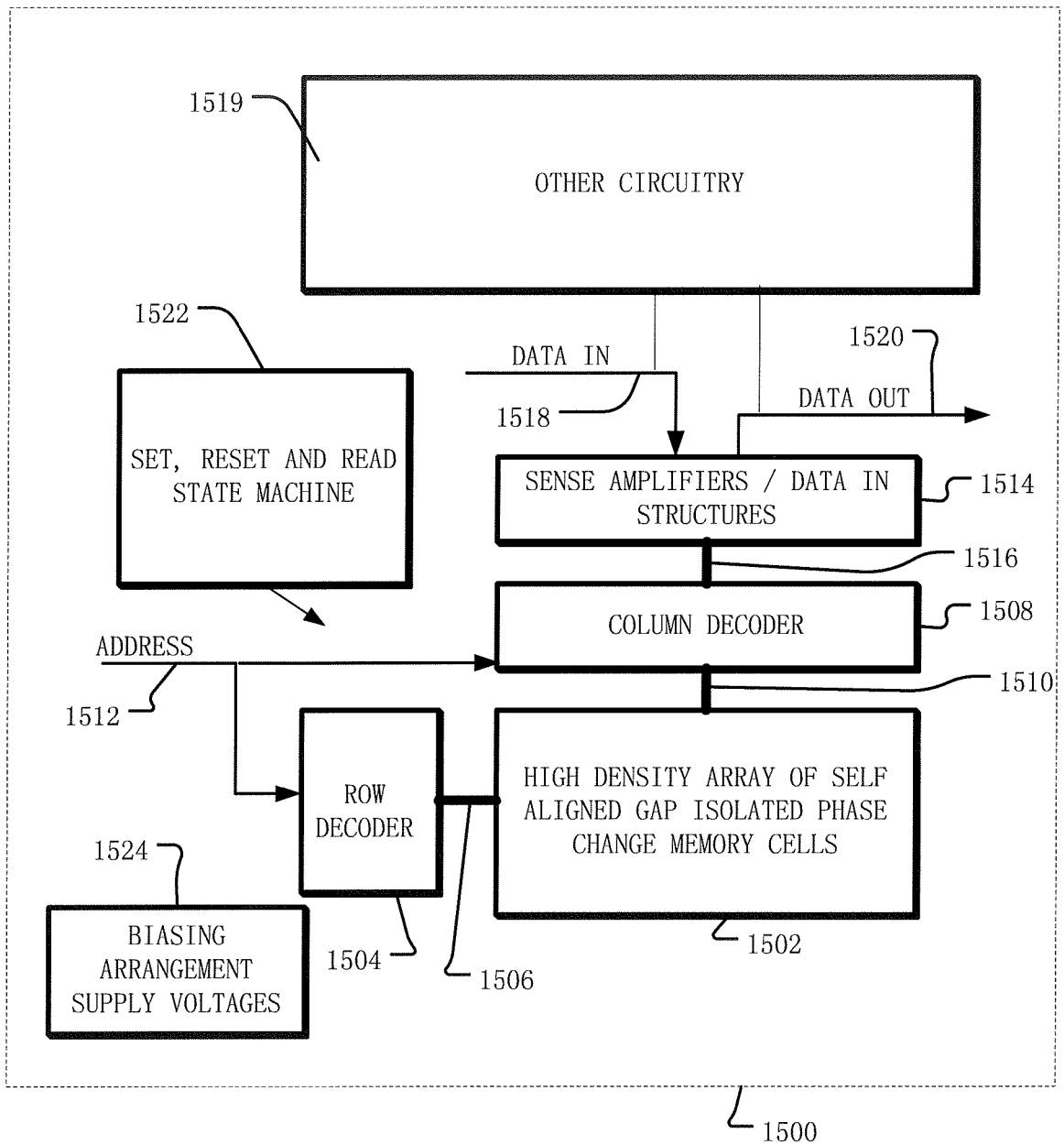
FIG. 15 is a block diagram of an integrated circuit device including a phase change memory array according to an embodiment.

FIG. 15 is a simplified block diagram of an integrated circuit 1500 according to an embodiment of the present invention. The integrated circuit 1500 includes a memory array 1502 implemented using self-aligned gap, phase change memory cells on a semiconductor substrate. A row decoder 1504 is coupled to a plurality of word lines 1506, and arranged along rows in the memory array 1502. A column decoder 1508 is coupled to a plurality of bit lines 1510 arranged along columns in the memory array 1502 for reading and programming data from the phase change memory cells in the memory array 1502. Addresses are supplied on bus 1512 to column decoder 1508 and row decoder 1504. Sense amplifiers and data-in structures in block 1514 are coupled to the column decoder 1508 via data bus 1516. Data is supplied via the data-in line 1518 from input/output ports on the integrated circuit 1500 or from other data sources internal (e.g. other circuitry 1519) or external to the integrated circuit 1500, to the data-in structures in block 1514. In the illustrated embodiment, other circuitry 1519 is included on the integrated circuit, such as a general purpose processor or special purpose application circuitry, or a combination of modules providing system-on-a-chip functionality supported by the thin film fuse phase change memory cell array. Data is supplied via the data-out line 1520 from the sense amplifiers in block 1514 to input/output ports on the integrated circuit 1500, or to other data destinations internal or external to the integrated circuit 1500.

A controller implemented in this example using bias arrangement state machine 1522 controls the application of bias arrangement supply voltages 1524, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Advantages of an embodiment described herein include that a gap forms between a memory material and dielectric material to disrupt the flow of heat from the memory material to the dielectric material during a set or re-set operation of the memory material. This better confines heat in a active region of the memory material, providing improved reliability and lower set/re-set power levels.

The invention has been described with reference to phase change materials. However, other memory materials, also sometimes referred to as programmable materials, can also be used. As used in this application, memory materials are those materials having electrical properties, such as resistance, that can be changed by the application of energy; the change can be a stepwise change or a continuous change or a combination thereof. Other programmable resistive memory materials may be used in other embodiments of the invention, including $N_2$ doped GST, $Ge_xSb_y$, or other material that uses different crystal phase changes to determine resistance; $Pr_xCayMnO_3$, PrSrMnO, $ZrO_x$, or other material that uses an electrical pulse to change the resistance state; TCNQ, PCBM, TCNQ-PCBM, Cu-TCNQ, Ag-TCNQ, C60-TCNQ, TCNQ doped with other metal, or any other polymer material that has bistable or multi-stable resistance state controlled by an electrical pulse. Further examples of programmable resistive memory materials include GeSbTe, GeSb, NiO, Nb—SrTiO$_3$, Ag—GeTe, PrCaMnO, ZnO, Nb$_2$O$_5$, Cr—SrTiO$_3$.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

The invention claimed is:

1. A memory device, comprising:
a first electrode;
a second electrode;
memory material defining an inter-electrode current path between the first electrode and the second electrode, the memory material having an active region which changes solid phase in response to heat;
shrinkable material proximate to the active region in the memory material, the shrinkable material being characterized by shrinkage in response to heat; and
a shrunken portion of the shrinkable material defining a gap between the memory material and the shrinkable material, the gap being aligned with the active region.

2. The device of claim 1, wherein the shrinkable material comprises porous dielectric material.

3. The device of claim 1, wherein the memory material forms a pillar of memory material between the first electrode and the second electrode.

4. The device of claim 3, wherein the gap is circumferential to the pillar of memory material.

5. The device of claim 1, wherein the memory material forms a bridge of memory material between the first electrode and the second electrode.

6. The device of claim 1, wherein the memory material forms a cap of memory material between the first electrode and the second electrode.

7. The device of claim 1, wherein the memory material is selectively reversibly programmable between a first state and a second state, the second state being more electrically resistive than the first state.

8. The device of claim 1, wherein the memory material comprises a chalcogenide.

9. The device of claim 8, wherein in the first state the active region has a generally crystalline phase and wherein in the second state the active region has a generally amorphous phase.

10. The device of claim 1, wherein the memory material comprises an alloy including a combination of Ge, Sb, and Te.

11. The device of claim 1, wherein the memory material comprises an alloy including a combination of two or more materials from the group of Ge, Sb, Te, Se, In, Ti, Ga, Bi, Sn, Cu, Pd, Pb, Ag, S, and Au.

12. The device of claim 1 further comprising a dielectric fill-in layer, the shrinkable layer being disposed between the memory material and the dielectric fill-in layer.

13. A memory device, comprising:
a substrate;
a first electrode layer on the substrate, the electrode layer including an array of conductive plugs surrounded by a dielectric fill layer;
an array of pillars of memory material on the conductive plugs;
an array of pillars of conductive material on the array of pillars of memory material;
a layer of shrinkable material around the array of pillars of memory material, the shrinkable material being characterized by shrinkage in response to heat;
dielectric fill-in material over the layer of shrinkable material;
a second electrode layer on the dielectric fill-in material and the array of pillars of conductive material; and
shrunken portions of the shrinkable material defining gaps between the layer of shrinkable material and at least some of the array of pillars of memory material, said gaps being aligned with active regions of memory cells of the memory device.

14. The device of claim 13, wherein the second electrode layer is a metal bit line layer.

15. The device of claim 13, wherein the memory material comprises a chalcogenide.

16. The device of claim 13, wherein the memory material comprises material selectively reversibly programmable between a first state and a second state, the second state being more electrically resistive than the first state.

17. The device of claim 16 wherein the first state includes a generally crystalline phase active region and wherein the second state includes a generally amorphous phase active region.

18. The device of claim 13, wherein the layer of shrinkable material comprises a porous dielectric material.

19. The device of claim 13, wherein a pillar of memory material has a diameter less than a minimum lithographic feature size of a lithographic process used to form the device.

20. The device of claim 13, wherein the memory material comprises an alloy including a combination of Ge, Sb, and Te.

21. The device of claim 13, wherein the memory material comprises an alloy including a combination of two or more materials from the group of Ge, Sb, Te, Se, In, Ti, Ga, Bi, Sn, Cu, Pd, Pb, Ag, S, and Au.

* * * * *

UNITED STATES PATENT AND TRADEMARK OFFICE
CERTIFICATE OF CORRECTION

PATENT NO. : 7,619,237 B2  Page 1 of 1
APPLICATION NO. : 11/677392
DATED : November 17, 2009
INVENTOR(S) : Hsiang-Lan Lung It is certified that error appears in the above-identified patent and that said Letters Patent is hereby corrected as shown below:

In column 5, line 41, delete the phrase "column six" and insert the phrase -- Group IV --.

Signed and Sealed this

Twenty-sixth Day of January, 2010

David J. Kappos
*Director of the United States Patent and Trademark Office*